United States Patent
Lee

(10) Patent No.: US 7,498,186 B2
(45) Date of Patent: *Mar. 3, 2009

(54) METHOD FOR PACKAGING ORGANIC LIGHT EMITTING DISPLAY WITH FRIT SEAL AND REINFORCING STRUCTURE

(75) Inventor: Jae Sun Lee, Yongin-si (KR)

(73) Assignee: Samsung SDI Co., Ltd. (KR)

( * ) Notice: Subject to any disclaimer, the term of this patent is extended or adjusted under 35 U.S.C. 154(b) by 43 days.

This patent is subject to a terminal disclaimer.

(21) Appl. No.: 11/529,910

(22) Filed: Sep. 29, 2006

(65) Prior Publication Data

US 2007/0194690 A1    Aug. 23, 2007

(30) Foreign Application Priority Data

Feb. 21, 2006   (KR) ............... 10-2006-0016857

(51) Int. Cl.
    *H01L 21/56* (2006.01)
    *H01L 21/78* (2006.01)
(52) U.S. Cl. .................. 438/28; 438/99; 438/458; 257/40
(58) Field of Classification Search .......... 438/26, 438/28, 82, 67, 114, 115, 116, 99, 458; 257/40
    See application file for complete search history.

(56) References Cited

U.S. PATENT DOCUMENTS

| | | | |
|---|---|---|---|
| 4,238,704 A | 12/1980 | Bonk et al. | |
| 6,555,025 B1 | 4/2003 | Krupetsky et al. | |
| 6,650,392 B2 * | 11/2003 | Iwanaga et al. | 349/153 |
| 6,791,660 B1 * | 9/2004 | Hayashi et al. | 349/190 |
| 6,998,776 B2 | 2/2006 | Aitken et al. | |
| 7,255,823 B1 * | 8/2007 | Guenther et al. | 264/263 |
| 2003/0020124 A1 | 1/2003 | Guenther | |
| 2003/0066311 A1 * | 4/2003 | Li et al. | 65/43 |

(Continued)

FOREIGN PATENT DOCUMENTS

| | | |
|---|---|---|
| JP | 09-278483 | 10/1997 |
| JP | 10-074583 | 3/1998 |

OTHER PUBLICATIONS

Search Report from the corresponding European Patent Application No. 07101294.2 dated Jun. 6, 2007.

*Primary Examiner*—David Vu
*Assistant Examiner*—Earl N Taylor
(74) *Attorney, Agent, or Firm*—Knobbe Martens Olson & Bear LLP

(57) ABSTRACT

Disclosed is a method for packaging an organic light emitting display having a reinforcing member formed between a first substrate and a second substrate by dipping non-pixel regions of unit display panels in a liquid curable material. Organic light emitting pixel arrays are formed at a plurality of pixel regions of a first mother substrate. A frit is formed at a position of the second mother substrate corresponding to non-pixel regions of the first mother substrate. The first and second mother substrates are coalesced to each other and sealed by the frit. The mother substrates are cut into unit display panels. The unit display panels are aligned. Non-pixel regions of the unit display panels are dipped in the liquid curable material and the material is cured to form the reinforcing member.

25 Claims, 9 Drawing Sheets

U.S. PATENT DOCUMENTS

| | | |
|---|---|---|
| 2003/0077396 A1 | 4/2003 | Lecompte et al. |
| 2003/0218422 A1* | 11/2003 | Park et al. .................. 313/512 |
| 2004/0141141 A1 | 7/2004 | Ota et al. |
| 2004/0217703 A1* | 11/2004 | Wittmann et al. ........... 313/512 |
| 2005/0088595 A1 | 4/2005 | Akiyama et al. |
| 2005/0200798 A1* | 9/2005 | Tanaka ....................... 349/155 |
| 2005/0233885 A1 | 10/2005 | Yoshida et al. |
| 2005/0248270 A1 | 11/2005 | Ghosh et al. |
| 2007/0120478 A1* | 5/2007 | Lee et al. ..................... 313/512 |
| 2007/0172971 A1* | 7/2007 | Boroson ....................... 438/26 |

* cited by examiner

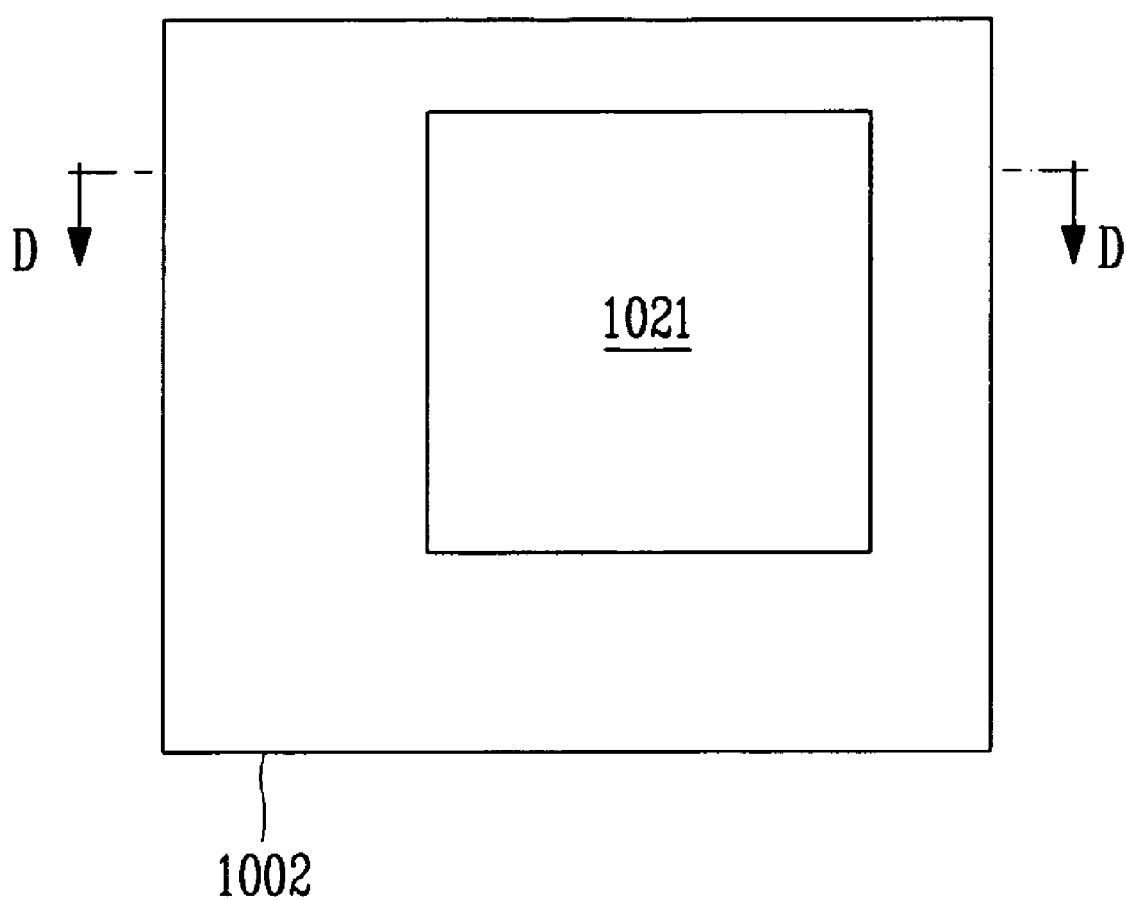

METHOD FOR PACKAGING ORGANIC LIGHT EMITTING DISPLAY WITH FRIT SEAL AND REINFORCING STRUCTURE

CROSS-REFERENCE TO RELATED APPLICATIONS

This application claims the benefit of Korean Patent Application No. 10-2006-0016857, filed on Feb. 21, 2006 in the Korean Intellectual Property Office, the disclosure of which is incorporated herein by reference in its entirety. This application is related to and incorporates herein by reference the entire contents of the following concurrently filed applications:

BACKGROUND

1. Field of the Invention

The present invention relates to organic light emitting display devices, and more particularly packaging of the devices.

2. Discussion of Related Art

In recent years, organic light emitting displays have been widely used and are relatively simple. The organic light emitting display is referred to as an organic light emitting device, and is an emissive device using an organic layer as an emission layer. Since the organic light emitting display can eliminate need for a back light as required in a liquid crystal display, it can be made thin and light weight. Thus, the organic light emitting display has been actively developed as

| Title | Atty. Docket No. | Filing Date | Application No. |
|---|---|---|---|
| ORGANIC LIGHT-EMITTING DISPLAY DEVICE AND METHOD OF FABRICATING THE SAME | SDISHN.043AUS | | |
| ORGANIC LIGHT-EMITTING DISPLAY DEVICE AND METHOD OF MANUFACTURING THE SAME | SDISHN.045AUS | | |
| ORGANIC LIGHT EMITTING DISPLAY DEVICE | SDISHN.048AUS | | |
| ORGANIC LIGHT-EMITTING DISPLAY DEVICE WITH FRIT SEAL AND REINFORCING STRUCTURE | SDISHN.051AUS | | |
| ORGANIC LIGHT EMITTING DISPLAY DEVICE METHOD OF FABRICATING THE SAME | SDISHN.052AUS | | |
| ORGANIC LIGHT EMITTING DISPLAY AND METHOD OF FABRICATING THE SAME | SDISHN.053AUS | | |
| ORGANIC LIGHT-EMITTING DISPLAY DEVICE WITH FRIT SEAL AND REINFORCING STRUCTURE BONDED TO FRAME | SDISHN.054AUS | | |
| METHOD FOR PACKAGING ORGANIC LIGHT EMITTING DISPLAY WITH FRIT SEAL AND REINFORCING STURUTURE | SDISHN.056AUS | | |
| ORGANIC LIGHT-EMITTING DISPLAY DEVICE AND THE PREPARATION METHOD OF THE SAME | SDISHN.060AUS | | |
| ORGANIC LIGHT EMITTING DISPLAY AND FABRICATING METHOD OF THE SAME | SDISHN.061AUS | | |
| ORGANIC LIGHT-EMITTING DISPLAY AND METHOD OF MAKING THE SAME | SDISHN.062AUS | | |
| ORGANIC LIGHT EMITTING DISPLAY AND FABRICATING METHOD OF THE SAME | SDISHN.063AUS | | |
| ORGANIC LIGHT EMITTING DISPLAY DEVICE AND MANUFACTURING METHOD THEREOF | SDISHN.064AUS | | |
| ORGANIC LIGHT-EMITTING DISPLAY DEVICE AND MANUFACTURING METHOD OF THE SAME | SDISHN.066AUS | | |
| ORGANIC LIGHT EMITTING DISPLAY AND FABRICATING METHOD OF THE SAME | SDISHN.067AUS | | |
| ORGANIC LIGHT EMITTING DISPLAY AND METHOD OF FABRICATING THE SAME | SDISW.017AUS | | |
| ORGANIC LIGHT EMITTING DISPLAY DEVICE METHOD OF FABRICATING THE SAME | SDISW.018AUS | | |
| ORGANIC LIGHT EMITTING DISPLAY AND METHOD OF FABRICATING THE SAME | SDISW.020AUS | | | a display panel in a portable information terminal such as mobile computer, portable telephone, portable game device, and electronic book.

In general, the organic light emitting display has a structure in which at least one organic layer having an emission layer is interposed between a pair of electrodes, namely, a first electrode and a second electrode. The first electrode is formed on a substrate, and functions as an anode to inject holes. An organic layer is formed at an upper portion of the first electrode. The second electrode is formed on the organic layer to face the first electrode, and functions as a cathode to inject electrons.

When moisture or oxygen from ambient environment is introduced in a device, the life of such an organic light emitting display is reduced, emission efficiency is deteriorated, and emission color changes due to oxidation and peeling. Therefore, in manufacturing the organic light emitting display, it is well known that the device is separate and sealed from an outside to prevent moisture from infiltrating into it. In the sealing method, after organic macromolecule such as polyester (PET) is laminated at an upper portion of the organic light emitting display, or a cover or a cap is formed by a glass or a metal having absorbent, the inside thereof is filled with nitrogen gas. Then, edges of the cover or the cap are capsule-sealed by a sealant such as epoxy.

However, it is impossible for the conventional method to prevent the introduction of device destructive factors such as moisture or oxygen from an outside by 100%. Consequently, a structure of the device is disadvantageous to be applied to an active surface emitting type organic light emitting display weak to moisture, and a process to embody such a method is complicated. In order to solve the aforementioned problems, a capsule sealing method is devised to enhance an adhesion between a device substrate and a cap using a frit as a sealant. U.S. Pat. No. 6,998,776 B2 discloses a structure of sealing an organic light emitting display by coating a frit at a glass substrate.

SUMMARY OF CERTAIN INVENTIVE ASPECTS

An aspect of the invention provides a method for making an organic light emitting display device, which may comprise: providing first and second devices, each device comprising: a first substrate comprising a first side surface, a second substrate comprising a first side surface and opposing the first substrate, an array of organic light emitting pixels interposed between the first and second substrates, a frit seal interposed between the first substrate and the second substrate while surrounding the array, wherein the frit seal, the first substrate and the second substrate together define an enclosed space in which the array is located, the frit seal comprising a first side surface, and a first side comprising the first side surfaces of the first substrate, the second substrates and the frit seal; arranging the first and second devices such that the first substrate of the first device faces the first or second substrate of the second device and that the first sides of the first and second devices face substantially the same direction; contacting a curable material on both the first sides of the first and second devices, whereby forming the curable material on both the first sides of the first and second devices; and curing the curable material formed on the first sides of the first and second devices, thereby forming a first structure contacting the first side of the first device and a second structure contacting the first side of the second device.

In the foregoing method, arranging may comprise providing a holder configured to hold the first and second devices, and holding the first and second devices such that the first substrate of the first device faces the first or second substrate of the second device and that the first sides of the first and second devices face substantially the same direction. Contacting may comprises holding the first and second devices together, and dipping the first and second devices as a whole into the curable material such that at least part of the first side of the first device contacts the curable material and that at least part of the first side of the second device contacts the curable material. Dipping may comprise moving the first and second devices together toward the curable material comprising a top surface, and adjusting facing of the first sides of the first and second devices such that the first side surface of the first substrate of the first or second device are generally parallel to the top surface immediately before the first side surface of the first substrate contacts the top surface.

Still in the foregoing method, the first substrate, the second substrate and the frit seal in combination may form a gap space outside the enclosed space in each of the first and second devices, and wherein at least part of the curable material may enter into the gap space. Contacting the curable material may comprise causing the curable material to enter into the gap space. At least part of the curable material entering into the gap space may spontaneously move toward the frit seal. The gap space may have a depth from the first side surface of the first substrate to the first side surface of the frit seal, and wherein the depth may be from about 0.3 to about 0.7 mm. The distance between the first substrate and the second substrate may be from about 2 to about 30 μm. The first substrate, the second substrate and the frit seal in combination may form a gap space outside the enclosed space in each of the first and second devices, and wherein at least part of the curable material enters into the gap space by capillary phenomenon.

Still in the foregoing method, contacting the curable material may comprise causing the curable material to contact at least part of the first side of the first device and at least part of the first side of the second device. Contacting the curable material may comprise causing the curable material to contact the first side surface of the frit seal in each of the first and second devices. The curable material may have a viscosity less than about 200 cP. Arranging may comprise placing an insert between the first substrate of the first device and the first or second substrate of the second device. Arranging may comprise contacting the first substrate of the first device with the first or second substrate of the second device. The first substrate of the first device may be arranged substantially parallel to the first or second substrate of the second device. The first side surface of the frit seal may be substantially parallel to the first side surface of the first substrate.

Still in the foregoing method, the first structure may contact the frit seal of the first device. The first structure may contact at least one of the first and second substrates. The first and second structures may be integrated after curing. The method may further comprise separating the first structure from the second structure. Each of the first and second devices may comprise a second side comprising second side surfaces of the first substrate, the second substrate and the frit seal, wherein the method may further comprise contacting the curable material with the second sides of the first and second devices. The liquid curable material may comprise a surface of the liquid, and wherein an angle between one of the substrates of the first and second devices and the surface may be about 5 to 90 degrees when dipping the first sides of the first and second devices. The liquid curable material may comprise a surface of the liquid, and wherein an angle between one of the substrates of the first and second devices and the surface may be about 10 to about 89 degrees when dipping the first sides of the first and second devices.

Still in the foregoing method, the method may further comprise providing at least one additional device comprising: a first substrate comprising a first side surface, a second substrate comprising a first side surface and placed over the first substrate, an array of organic light emitting pixels interposed between the first and second substrates, a frit seal interposed between the first substrate and the second substrate while surrounding the array, wherein the frit seal, the first substrate and the second substrate may together define an enclosed space in which the array is located, the frit seal comprising a first side surface, and a first side comprising the first side surfaces of the first substrate, the second substrates and the frit seal, wherein arranging may further arrange the at least one additional device together with the first and second devices, wherein contacting may further contact the curable material on the at least one additional device, and wherein curing may form at least one additional structure, each of which contacts the first side of each of the at least one additional device. The curable material may be adapted to be a reinforcing material. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

An aspect of the present invention provides a method for manufacturing an organic light emitting display, which fill a reinforcing member in a liquid phase between a first substrate and a second substrate by dipping non-pixel regions of unit display panels in the reinforcing member.

Another aspect of the present invention provides a method for manufacturing an organic light emitting display, comprising the steps of: (i) forming an organic light emitting device at a plurality of pixel regions of a first mother substrate, the first mother substrate including the plurality of pixel regions and a plurality of non-pixel regions; (ii) forming a frit at a second mother substrate corresponding to the non-pixel regions of the first mother substrate; (iii) coalescing the second mother substrate to the first mother substrate so that the plurality of pixel regions of the first mother substrate are sealed by the frit; (iv) cutting the first and second mother substrates coalesced to separate the first and second mother substrates from unit display panels; (v) aligning the unit display panels; and (vi) dipping non-pixel regions of the unit display panels at a reinforcing member to fill the reinforcing member between the first substrate and the second substrate of an outer side of the frit by a capillary phenomenon. Each of the non-pixel regions is between the first mother substrate and the second mother substrate of an outer side in which the frit is formed. The method further comprises a step of curing the reinforcing member after filling the reinforcing member between the first and second mother substrates.

BRIEF DESCRIPTION OF THE DRAWINGS

These and other aspects and advantages of the invention will become apparent and more readily appreciated from the following description of the embodiments, taken in conjunction with the accompanying drawings of which:

FIG. 3C is a schematic top plan view of an organic light emitting display in accordance with one embodiment;

DETAILED DESCRIPTION OF EMBODIMENTS

Hereinafter, embodiments according to the present invention will be described with reference to the accompanying drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 3A:
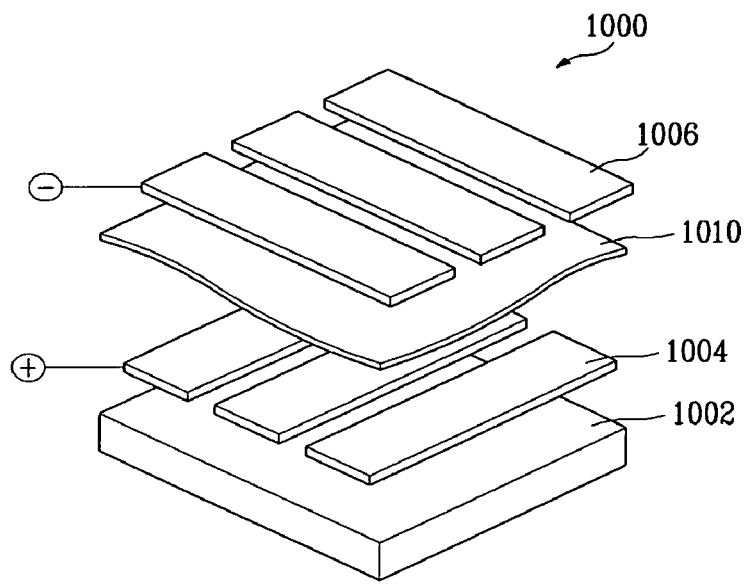
FIG. 3A is a schematic exploded view of a passive matrix type organic light emitting display device in accordance with one embodiment.
Figure 3B:
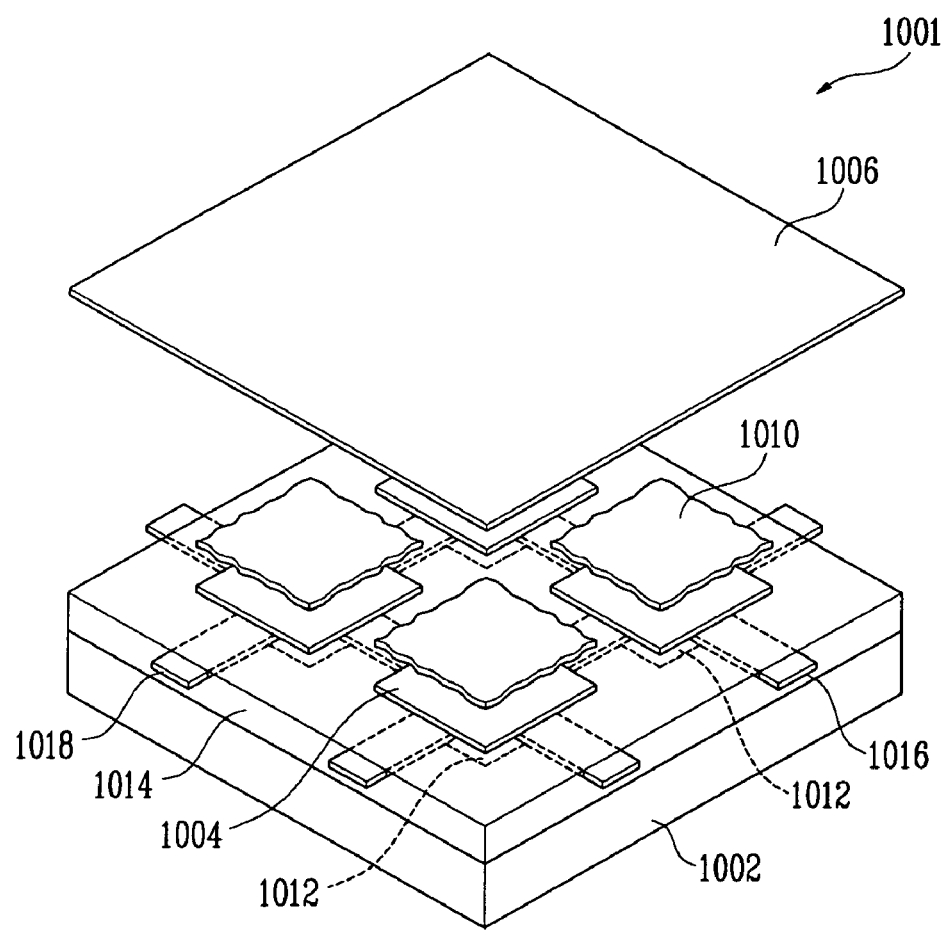
FIG. 3B is a schematic exploded view of an active matrix type organic light emitting display device in accordance with one embodiment.

OLEDs can be generally grouped into two basic types dependent on the arrangement with which the stimulating electrical current is provided. FIG. 3A schematically illustrates an exploded view of a simplified structure of a passive matrix type OLED 1000. FIG. 3B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 3A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 3B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

In many embodiments, an OLED pixel array 1021 comprising a plurality of organic light emitting pixels is arranged over a substrate 1002 as shown in FIG. 3C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 3D:
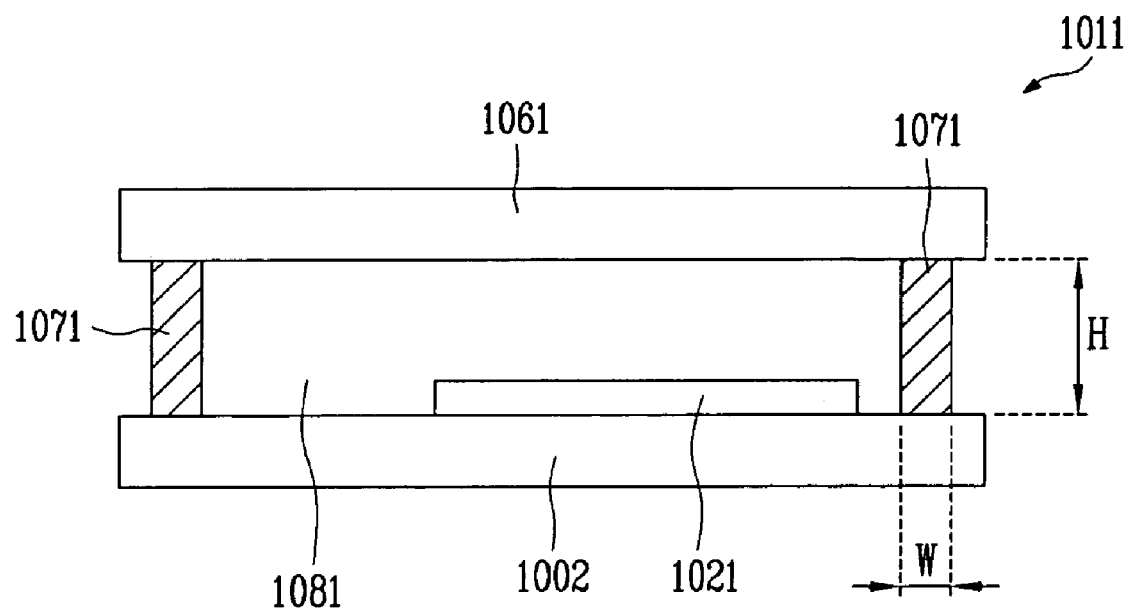
FIG. 3D is a cross-sectional view of the organic light emitting display of FIG. 3C, taken along the line d-d.

One design and fabrication consideration in OLED devices is that certain organic material layers of OLED devices can suffer damage or accelerated deterioration from exposure to water, oxygen or. other harmful gases. Accordingly, it is generally understood that OLED devices be sealed or encapsulated to inhibit exposure to moisture and oxygen or other harmful gases found in a manufacturing or operational environment. FIG. 3D schematically illustrates a cross-section of an encapsulated OLED device 1011 having a layout of FIG. 3C and taken along the line d-d of FIG. 3C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 3D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 3D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 3E:
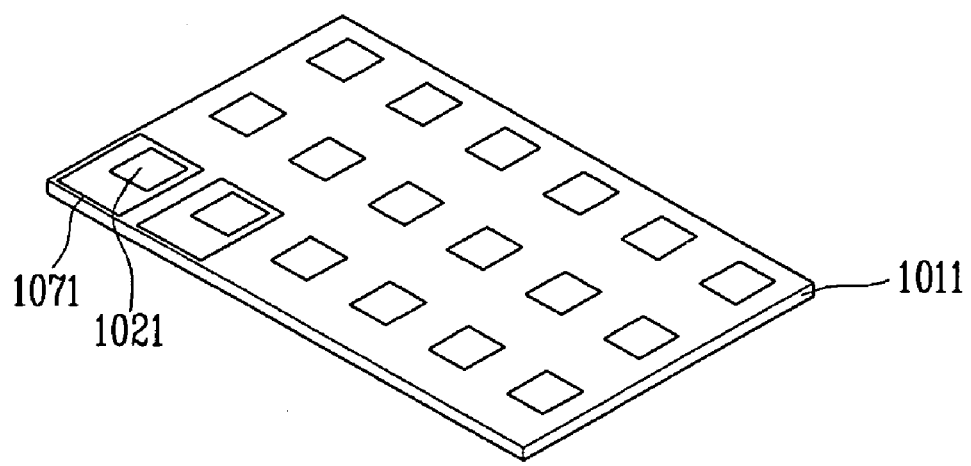
FIG. 3E is a schematic perspective view illustrating mass production of organic light emitting devices in accordance with one embodiment.

In some embodiments, OLED devices 1011 are mass produced. In an embodiment illustrated in FIG. 3E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 3D. In certain embodiments, the individual OLED devices 1011 then further undergo additional packaging operations to further improve the sealing formed by the frit seal 1071 and the top and bottom substrates 1061, 1002.

Occasionally, the sealing material may not completely prevent moisture or air entering into the enclosed space. Also, there may be cracks in the sealing material and in the interfacial area where the sealing material contacts the substrate for various reasons.

FIG. 1a to FIG. 1f are cross-sectional views showing a method for manufacturing an organic light emitting display according to an embodiment of the present invention. FIG. 2a to FIG. 2f are perspective views showing a method for manufacturing an organic light emitting display according to an embodiment of the present invention. FIG. 1a to FIG. 1f and FIG. 2a to FIG. 2f illustrate an embodiment of the present invention, but the present invention is not limited to the embodiments illustrated in FIG. 1a to FIG. 1f and FIG. 2a to FIG. 2f.

Figure 1A:
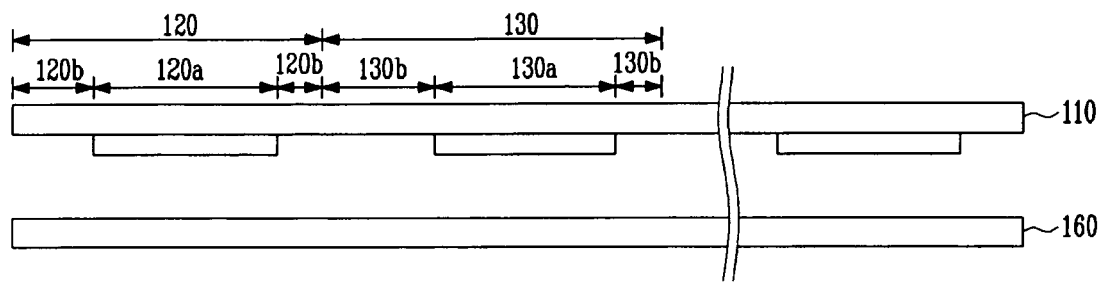
FIG. 1a to FIG. 1f are cross-sectional views showing a method for manufacturing an organic light emitting display according to an embodiment of the present invention.
Figure 2A:
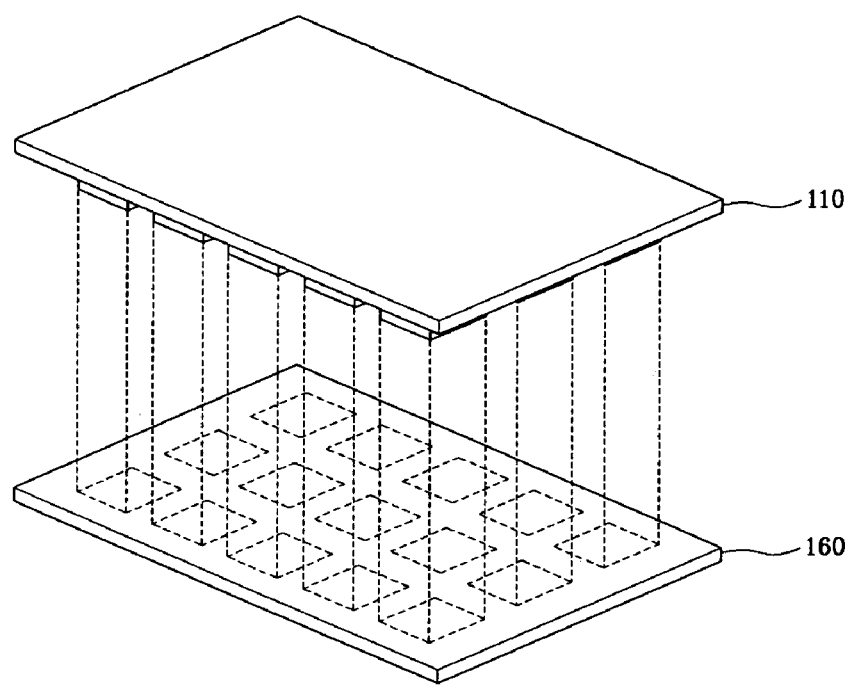
FIG. 2a to FIG. 2f are perspective views showing a method for manufacturing an organic light emitting display according to an embodiment of the present invention.

Hereinafter, two display panels among a plurality of display panels that are continuously arranged, are referred to as first display panel 120 and a second display panel 130, respectively. With reference to FIG. 1a and FIG. 2a, at least the first display panel 120 and the second display panel 130 are formed at a first mother substrate 110 in such a way that they are arranged in sequence. The first display panel 120 includes a first pixel region 120a and a first non-pixel region 120b. The second display panel 130 includes a second pixel region 130a and a second non-pixel region 130b. A second mother substrate 160 is positioned at a lower portion of the first mother substrate 110, and covers the first mother substrate 110. A cut line (not shown) is formed at each of the first mother substrate 110 and the second mother substrate 120, which separates respective display panels from each other. For example, a cut line is formed at a boundary between the first pixel region 120b of the first display panel 120 and the second non-pixel region 130b of the second display panel 130.

Figure 1B:
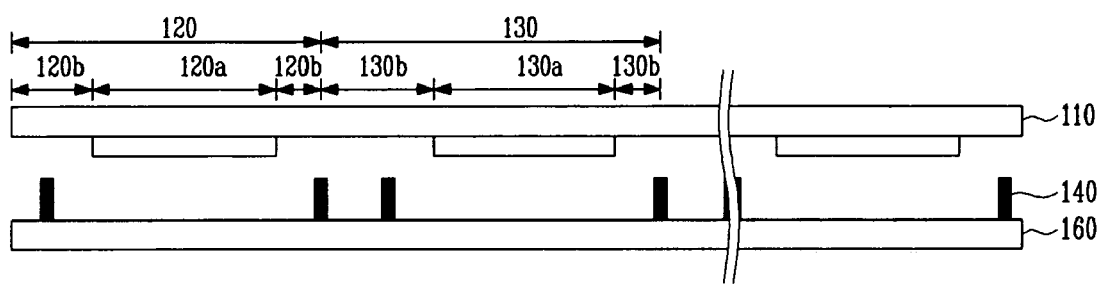
Figure 2B:
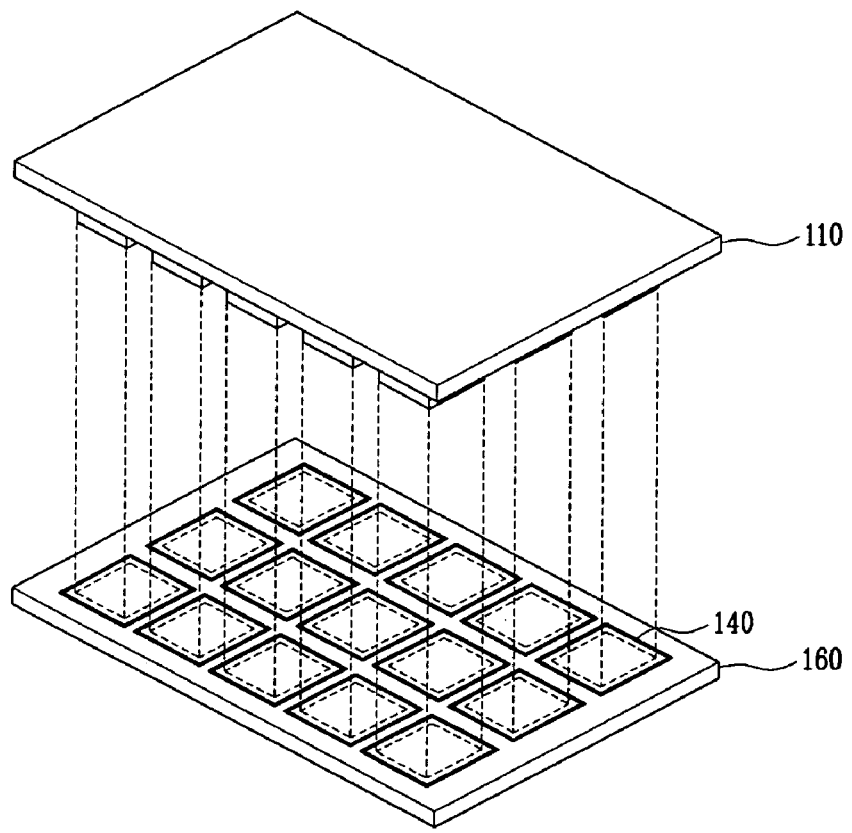

Referring to FIG. 1b and 2b, in one surface of the second mother substrate 160, a frit 140 is coated at a part corresponding to a peripheral portion of each of the pixel regions 120a and 130a, which seals at least the pixel regions 120a and 130a of the first mother substrate 110. That is, the frit 140 is coated along a peripheral region corresponding to the pixel regions 120a and 130a formed in the first mother substrate 110. In an embodiment, the frit 140 includes a filler (not shown) and an absorbent (not shown). The filler adjusts a thermal expansion coefficient of the frit 140. The absorbent adsorbs laser or infrared ray. The frit 140 is made in a form of a glass powder having an oxide powder. By rapidly reducing a temperature of a heated glass material, the frit 140 is formed in a glass powder pattern. Organic substance is added to the frit 140 to make a paste in a gel state. Then, the frit 140 is sintered at a predetermined temperature to remove the organic substance. The frit paste in a gel state is cured to form the frit seal 140 in a solid state. In an embodiment, preferably, a temperature of sintering the frit 140 ranges from about 300° C. to about 700° C.

Figure 1C:
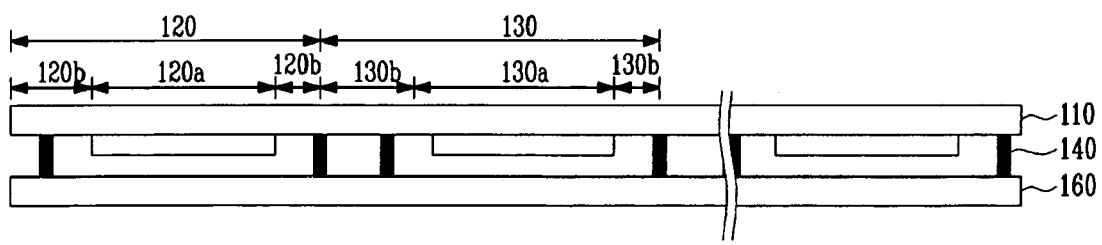
Figure 2C:
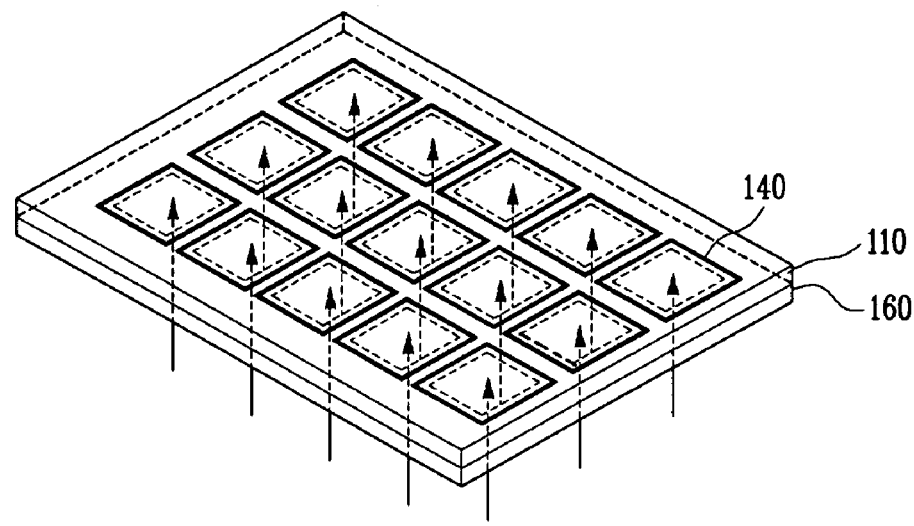

With reference to FIG. 1c and FIG. 2c, after the first mother substrate 110 and the second mother substrate 160 are coalesced to each other, a laser or infrared ray is irradiated to the frit 140, thereby melting the frit 140, and then the frit is cured. Accordingly, the first mother substrate 110 and the second mother substrate 160 are coalesced to each other. The second mother substrate 160 covers the first mother substrate 110, predetermined encloses space is formed in the device and organic light emitting pixels are protected from external oxygen or moisture.

Figure 1D:
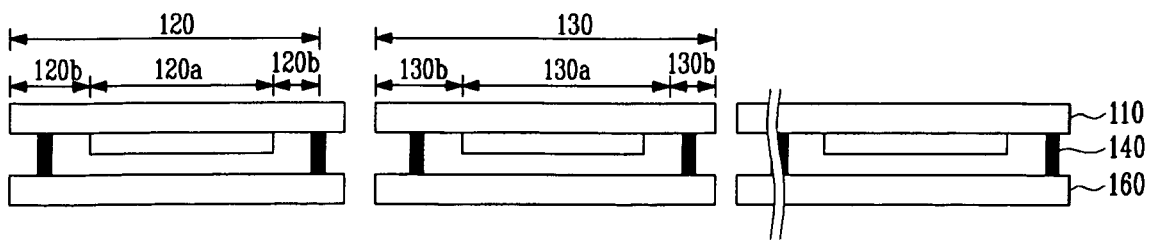
Figure 2D:
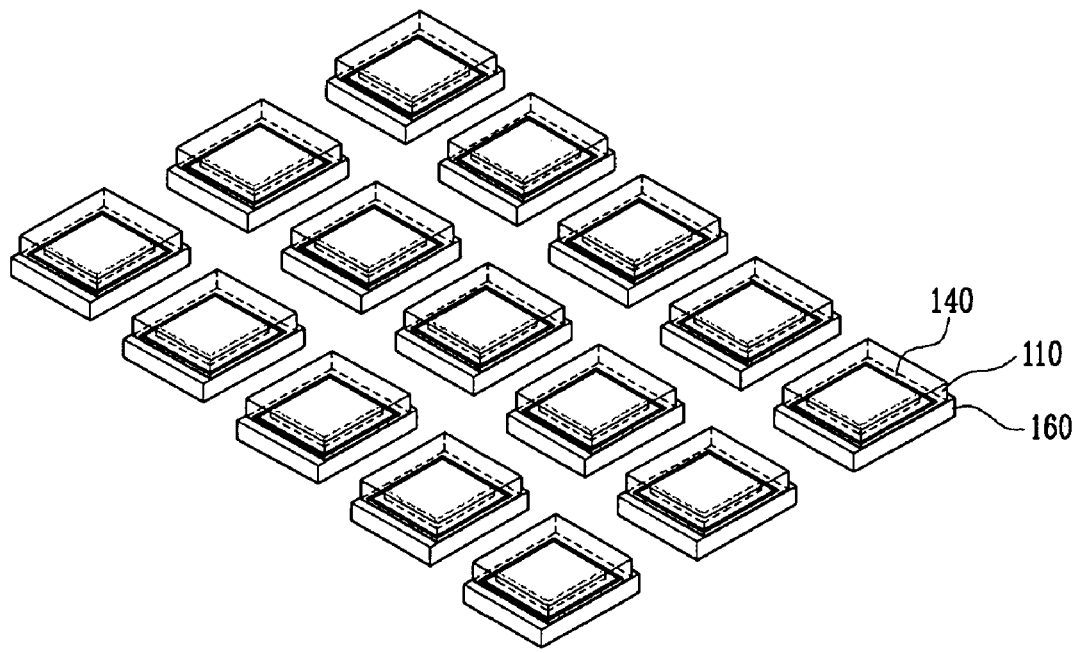

Referring to FIG. 1d and FIG. 2d, a cutting process is performed using a cutting machine, and then the first and second mother substrates 110 and 160 coalesced is divided into respective unit display panels. The cutting process is carried out along a cut line (not shown) formed on the first and second mother substrates 110 and 160.

Figure 1E:
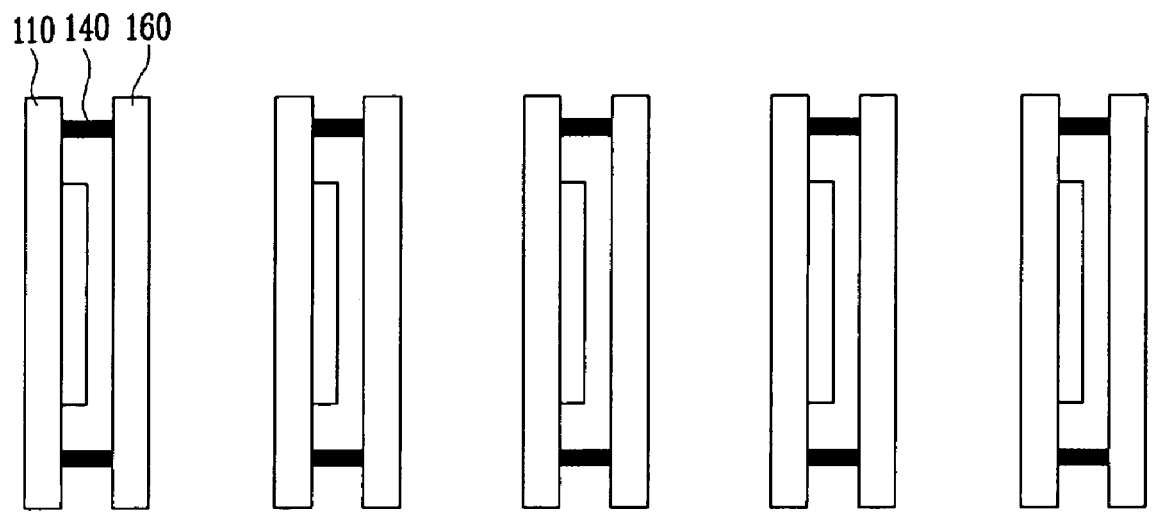
Figure 2E:
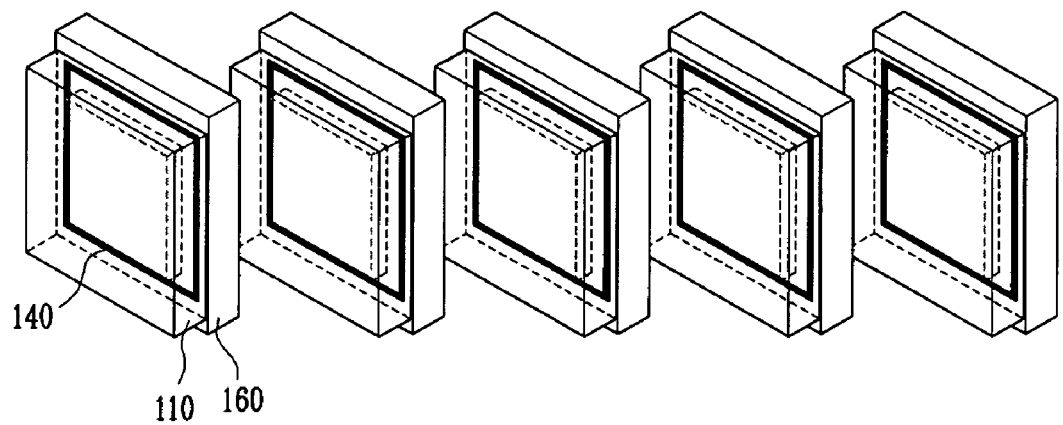

With reference to FIG. 1e and FIG. 2e, the divided unit display panels or unfinished devices are aligned inside an alignment means (not shown). A slot and a partition are provided inside the alignment means to have a structure capable of receiving unit display panels. In an embodiment the unit display panels are aligned inside the alignment means to be adjacent to each other. A first substrate of a unit display panel which is one of aligned unit display panels and a second substrate in another aligned unit display panel, which is adjacent to the unit display panel, are facing each other and apart from each other or attached to each other. A reinforcing member 150 is formed at once in each unit display panel by using alignment means to reduce a process time.

Furthermore, a groove may be formed at a lower side surface of the alignment means of so that the reinforcing material in a liquid state contacts with one side surface of the unit display panels. Materials which do not have adhesive strength with the reinforcing material may be used in the alignment means in order to easily separate the unit display panels.

Figure 1F:
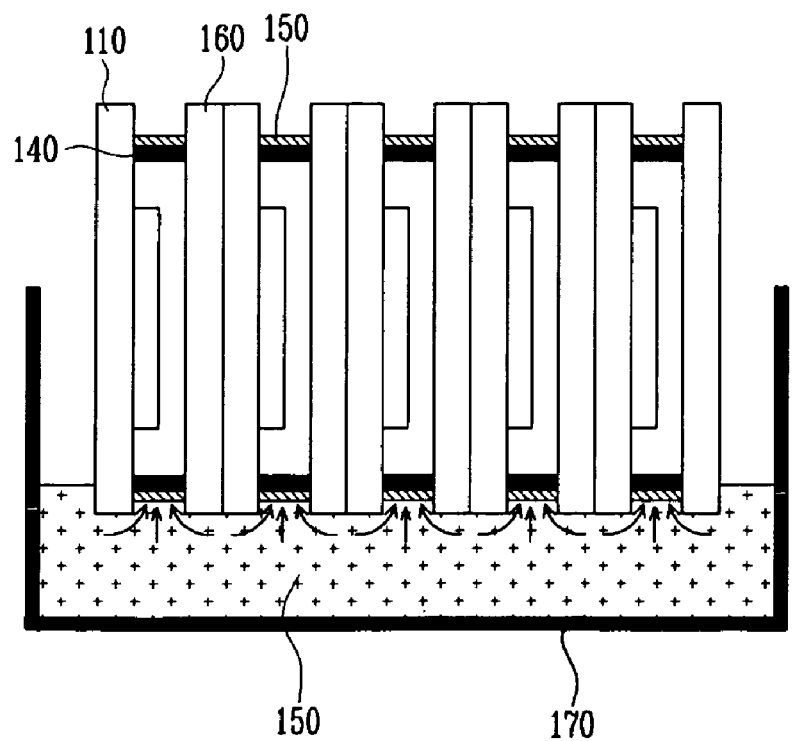
Figure 1G:
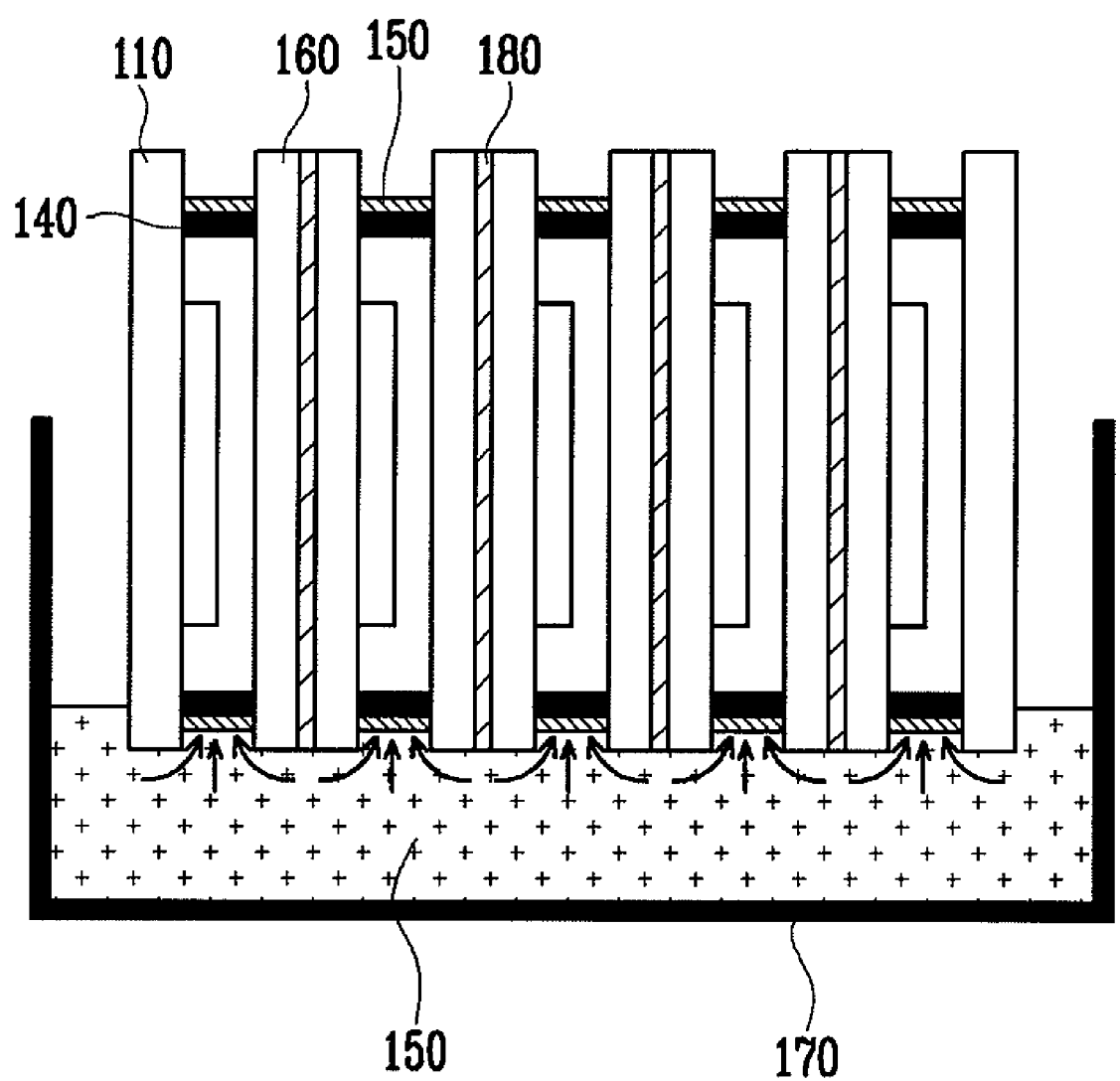
FIG. 1G is a schematic side view of a plurality of organic light emitting display devices with inserts interposed between the plurality of organic light emitting display devices.
Figure 2F:
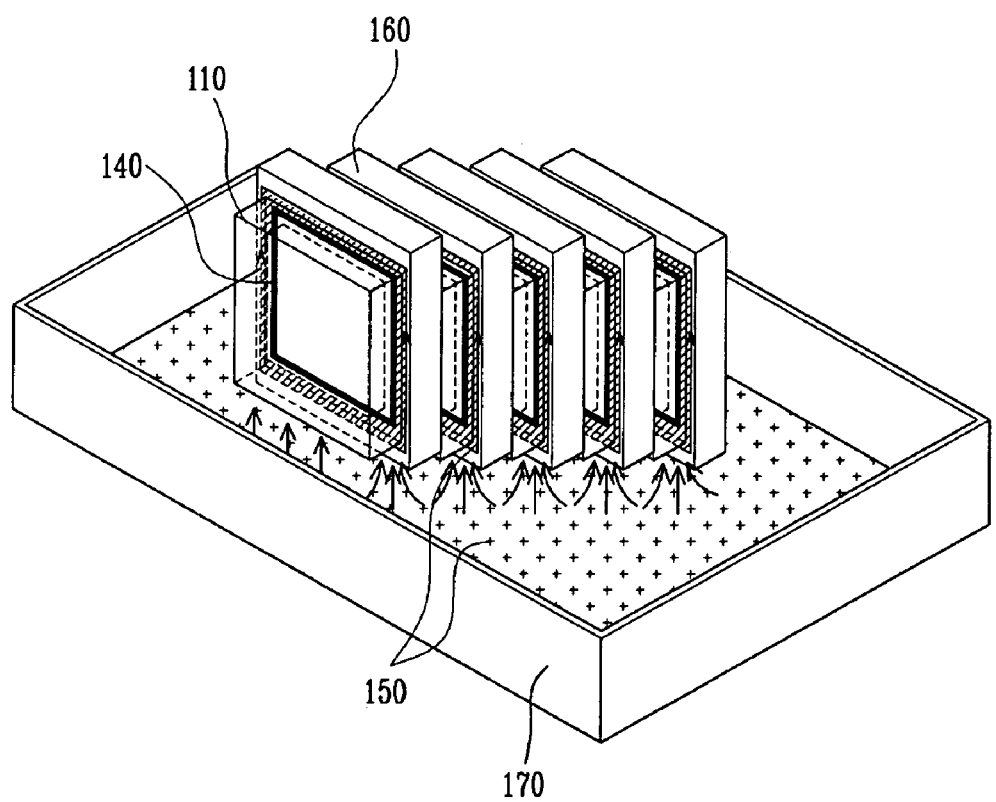

With reference to FIG. 1*f* and FIG. 2*f*, the alignment means in which the unit display panels are aligned is positioned or dipped in a liquid tub 180 containing the reinforcing material in a liquid state. Thereafter, through the groove formed at a lower side of the alignment means, the reinforcing material in the liquid state contacts non-pixel regions of the unit display panel between the first substrate 110 and the second substrate 160 and outside the fit 140. Owing to a capillary phenomenon, the reinforcing material in a liquid state is filled between the first substrate 110 and the second substrate 160 and outside the fit 140. In an embodiment, liquid material having a low viscous property less than about 200 cp can be used as the reinforcing material. Acrylate cyanide, acrylate, epoxy, acrylate and urethane acrylate may be used as the reinforcing material. The acrylate cyanide is a material that is naturally cured. The acrylate is a material that is thermally cured at a temperature less than about 80° C. The epoxy, acrylate and urethane are a material that is cured by ultra-violet ray. After separating the unit display panels positioned inside the alignment means, ultra-violet curing, natural curing, or thermal process for the reinforcing material in a liquid state filled between the first mother substrate 110 and the second mother substrate 160 is performed to form the reinforcing member 150. Consequently, a completed unit display device or panel is formed. Referring to FIG. 1G, in one embodiment, an insert 180 is interposed between the substrates 110 and 160 of two neighboring devices.

As apparent from the above description, in accordance with the present invention, a reinforcing member is further formed outside a frit adhering first and second substrates to each other. This may prevent an organic light emitting display from easily being broken due to impact, and improve reliability of the device. Moreover, this may perfectly protect organic light emitting pixels from the ambient environment. Also, by simultaneously dipping non-pixel regions of the unit display panels in a reinforcing material in a liquid phase, the reinforcing member is formed between the first and second substrates. Accordingly, this method can reduce a process time as compared with a method of forming reinforcing members one by one of respective unit display panels, and therefore, the present invention extremely enhances mass production of an organic light emitting display.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A method for making an organic light emitting display device, the method comprising:
    providing first and second devices, each device comprising:
        a first substrate comprising a first side surface and a front surface,
        a second substrate comprising a first side surface and a rear surface and opposing the first substrate, wherein the front and rear surfaces face away from each other,
        an array of organic light emitting pixels interposed between the first and second substrates,
        a display surface configured to display an image thereon, wherein the display surface is at least part of at least one of the front and rear surfaces,
        a frit seal interposed between the first substrate and the second substrate while surrounding the array, wherein the frit seal, the first substrate and the second substrate together define an enclosed space in which the array is located, the frit seal comprising a first side surface, and
        a first side comprising the first side surfaces of the first substrate, the second substrates and the frit seal;
    arranging the first and second devices such that the front surface of the first device opposes the front or rear surface of the second device and that the first sides of the first and second devices face substantially the same direction;
    contacting a curable material on both the first sides of the first and second devices, whereby forming the curable material on both the first sides of the first and second devices; and
    curing the curable material formed on the first sides of the first and second devices, thereby forming a first structure contacting the first side of the first device and a second structure contacting the first side of the second device.

2. The method of claim 1, wherein arranging comprises:
    holding the first and second devices such that the front surface of the first device faces the front or rear surface of the second device and that the first sides of the first and second devices face substantially the same direction.

3. A method for making an organic light emitting display device, the method comprising:
    providing first and second devices, each device comprising:
        a first substrate comprising a first side surface,
        a second substrate comprising a first side surface and opposing the first substrate,
        an array of organic light emitting pixels interposed between the first and second substrates,
        a frit seal interposed between the first substrate and the second substrate while surrounding the array, wherein the frit seal, the first substrate and the second substrate together define an enclosed space in which the array is located, the frit seal comprising a first side surface, and
        a first side comprising the first side surfaces of the first substrate, the second substrates and the frit seal;
    arranging the first and second devices such that the first substrate of the first device faces the first or second substrate of the second device and that the first sides of the first and second devices face substantially the same direction;
    contacting a curable material on both the first sides of the first and second devices, whereby forming the curable material on both the first sides of the first and second devices; and
    curing the curable material formed on the first sides of the first and second devices, thereby forming a first structure contacting the first side of the first device and a second structure contacting the first side of the second device,
    wherein contacting comprises:
        holding the first and second devices together; and
        dipping the first and second devices as a whole into the curable material such that at least part of the first side of the first device contacts the curable material and that at least part of the first side of the second device contacts the curable material.

4. The method of claim 3, wherein dipping comprises:
moving the first and second devices together toward the curable material comprising a top surface; and
adjusting facing of the first sides of the first and second devices such that the first side surface of the first substrate of the first or second device are generally parallel to the top surface immediately before the first side surface of the first substrate contacts the top surface.

5. The method of claim 1, wherein the first substrate, the second substrate and the frit seal in combination form a gap space outside the enclosed space in each of the first and second devices, and wherein at least part of the curable material enters into the gap space.

6. The method of claim 5, wherein contacting the curable material comprises causing the curable material to enter into the gap space.

7. The method of claim 6, wherein at least part of the curable material entering into the gap space spontaneously moves toward the frit seal.

8. The method of claim 5, wherein the gap space has a depth from the first side surface of the first substrate to the first side surface of the frit seal, and wherein the depth is from about 0.3 to about 0.7 mm.

9. The method of claim 5, wherein the distance between the first substrate and the second substrate in the gap space is from about 2 to about 30 μm.

10. A method for making an organic light emitting display device, the method comprising:
providing first and second devices, each device comprising:
a first substrate comprising a first side surface,
a second substrate comprising a first side surface and opposing the first substrate,
an array of organic light emitting pixels interposed between the first and second substrates,
a frit seal interposed between the first substrate and the second substrate while surrounding the array, wherein the frit seal, the first substrate and the second substrate together define an enclosed space in which the array is located, the frit seal comprising a first side surface, and
a first side comprising the first side surfaces of the first substrate, the second substrates and the frit seal;
arranging the first and second devices such that the first substrate of the first device faces the first or second substrate of the second device and that the first sides of the first and second devices face substantially the same direction;
contacting a curable material on both the first sides of the first and second devices, whereby forming the curable material on both the first sides of the first and second devices; and
curing the curable material formed on the first sides of the first and second devices, thereby forming a first structure contacting the first side of the first device and a second structure contacting the first side of the second device, wherein the first substrate, the second substrate and the frit seal in combination form a gap space outside the enclosed space in each of the first and second devices, and wherein at least part of the curable material enters into the gap space by capillary phenomenon.

11. The method of claim 1, wherein contacting the curable material comprises causing the curable material to contact at least part of the first side of the first device and at least part of the first side of the second device.

12. The method of claim 1, wherein contacting the curable material comprises causing the curable material to contact the first side surface of the frit seal in each of the first and second devices.

13. The method of claim 1, wherein the curable material has a viscosity less than about 200 cP.

14. The method of claim 1, wherein arranging comprises placing an insert between the first substrate of the first device and the first or second substrate of the second device.

15. The method of claim 1, wherein arranging comprises contacting the first substrate of the first device with the first or second substrate of the second device.

16. The method of claim 1, wherein the first substrate of the first device is arranged substantially parallel to the first or second substrate of the second device.

17. The method of claim 1, wherein the first side surface of the frit seal is substantially parallel to the first side surface of the first substrate.

18. The method of claim 1, wherein the first structure contacts the frit seal of the first device.

19. The method of claim 1, wherein the first structure contacts at least one of the first and second substrates.

20. The method of claim 1, wherein the first and second structures are integrated after curing.

21. The method of claim 20, further comprising separating the first structure from the second structure.

22. The method of claim 1, wherein each of the first and second devices comprises a second side comprising second side surfaces of the first substrate, the second substrate and the frit seal, wherein the method further comprises contacting the curable material with the second sides of the first and second devices.

23. The method of claim 1, further comprising providing at least one additional device comprising:
a first substrate comprising a first side surface,
a second substrate comprising a first side surface and opposing the first substrate,
an array of organic light emitting pixels interposed between the first and second substrates,
a frit seal interposed between the first substrate and the second substrate while surrounding the array, wherein the frit seal, the first substrate and the second substrate together define an enclosed space in which the array is located, the frit seal comprising a first side surface, and
a first side comprising the first side surfaces of the first substrate, the second substrates and the frit seal;
wherein arranging further arranges the at least one additional device together with the first and second devices;
wherein contacting further contacts the curable material on the at least one additional device; and
wherein curing forms at least one additional structure, each of which contacts the first side of each of the at least one additional device.

24. The method of claim 1, wherein the curable material is adapted to be a reinforcing material.

25. The method of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

* * * * *